United States Patent [19]

Watanabe et al.

[11] 4,295,165
[45] Oct. 13, 1981

[54] TELEVISION SIGNAL DISCRIMINATION SYSTEM IN A TELEVISION RECEIVER

[75] Inventors: Yasuaki Watanabe, Kasukabe; Teruaki Noda, Noda, both of Japan

[73] Assignee: Victor Company of Japan, Ltd., Yokohama, Japan

[21] Appl. No.: 122,263

[22] Filed: Feb. 19, 1980

[30] Foreign Application Priority Data

Feb. 19, 1979 [JP] Japan .................................. 54-18233

[51] Int. Cl.$^3$ .............................................. H04N 5/50
[52] U.S. Cl. ................................................. 358/193.1
[58] Field of Search ........................... 358/191.1, 193.1

[56] References Cited
U.S. PATENT DOCUMENTS 4,205,347  5/1980  Minoura et al. .................. 358/193.1

Primary Examiner—John C. Martin
Attorney, Agent, or Firm—Haseltine & Lake

[57] ABSTRACT

A television signal discrimination system is used in a television receiver provided with an electronic tuner for producing as output an intermediate-frequency signal whose synchronizing frequency is varied in response to an applied voltage and with a circuit for detecting the output signal of the electronic tuner. This system comprises a first synchronizing signal separation circuit supplied with the output of the detection circuit and separating a vertical synchronizing signal, a first integration circuit connected to the output side of the first synchronizing signal separation circuit, a circuit supplied with an output voltage of the first integration circuit and a reference voltage and operating to compare the magnitudes thereof, a second synchronizing signal separation circuit supplied with the output of the detection circuit and separating a vertical synchronizing signal, a second integration circuit connected to the output side of the second synchronizing signal separation circuit, a circuit for discriminating the frequency of the output of the electronic tuner, and a circuit for discriminating a normal television signal on the basis of the output of the voltage comparing circuit, the output of the second integration circuit, and the output of the frequency discriminating circuit. The first synchronizing signal separation circuit and the first integration circuit producing, as output, different voltages, with the reference voltage as a borderline, depending on and distinguishing between the case where the output signal of the detection circuit is a normal television signal and the case where the output signal is a different spurious television signal.

6 Claims, 5 Drawing Figures

TELEVISION SIGNAL DISCRIMINATION SYSTEM IN A TELEVISION RECEIVER

BACKGROUND OF THE INVENTION

The present invention relates generally to television signal discrimination systems in television receivers and more particularly to a system which, in the automatic searching of channels in a television receiver having an electronic tuner of memory type, accurately discriminates only the regular or normal television signal without storing by error a datum of a spurious television signal.

In general, as a television receiver of electronic tuning-channel selection memory type, a television receiver provided with an electronic tuner, a memory in which data relating to channels whose signals are to be received have been stored, and a microprocessor for operating these components has been known. When a desired channel is to be selected, the microprocessor causes the electronic tuner to undergo channel selection in response to the stored content of the memory.

When a television receiver of the above described system is being installed in a certain reception place, it is necessary to cause the memory to store the data relating to the channels which can be received at that reception place. As a system for automatically searching for all channels which the receiver can receive (hereinafter referred to as automatic channel search) and causing the memory to store data in accordance with the frequencies of all of the channels, a so-called voltage synthesizer system is known.

In this system, as will be described hereinafter in conjunction with an accompanying drawing, an electronic tuner undergoes automatic channel search operation in response to an indication from a microprocessor, which detects the reception of the signal of a certain channel from the output of a frequency discriminator and the vertical synchronizing signal separated from the received television signal and causes the memory to store data conforming to the frequency of that channel.

However, in the case where the television receiver is installed under a strong electric field, a higher harmonic wave is generated by a high-frequency amplifier in the electronic tuner. Furthermore, cross modulation and intermodulation occur between the television signals of two or more channels. In this case, a spurious television signal differing from the television signal of the normal channel is generated as a useless signal in a frequency position other than the normal channel frequency over a wide frequency range. In a spurious television signal of this character, in addition to a vertical synchronizing signal in every vertical scanning period, there exist one or a plurality of other vertical synchronizing signals within that period. Furthermore, on the output detected video signal waveform, the entire television signal level is subjected to modulation, whereby the envelope is fluctuating.

Since this spurious television signal is originally a useless signal and should not be channel selected, it should not be stored in the memory during automatic channel search. However, in the known automatic channel search system, erroneous operation due to the vertical synchronizing signals of the spurious television signal occurs, and the data of this spurious television signal also becomes disadvantageously stored.

Accordingly, a method of detecting the presence or absence of a useless vertical synchronizing signal within one vertical scanning period would appear to be possible. However, if the microprocessor were to have a circuit organization for continually carrying out the above mentioned detection, it would become expensive and impractical. Furthermore, it would be difficult to distinguish between a useless vertical synchronizing signal and a simple external noise.

SUMMARY OF THE INVENTION

Accordingly, it is a general object of the present invention to provide a new and useful television signal discrimination system in a television receiver in which the above described difficulties have been overcome.

Another and specific object of the invention is to provide, in a television receiver having a memory type electronic tuner, a system for discriminating between a spurious television signal which is different from a normal television signal and is generated by a cause such as the generation of a higher harmonic or the occurrence of cross modulation or intermodulation. In the system of the invention, the fact that the width of the vertical synchronizing signal separated from a spurious television signal is greater than the width of the vertical synchronizing signal separated from a normal television signal is utilized to detect the identity of a television signal as a spurious television signal.

Still another object of the invention is to provide a television signal discrimination system in a television receiver which is so adapted that, when a spurious television signal is discriminated, storing of data in a memory is not carried out.

Other objects and further features of the present invention will be apparent from the following detailed description with respect to preferred embodiments thereof when read in conjunction with the accompanying drawings.

DETAILED DESCRIPTION

Figure 1:
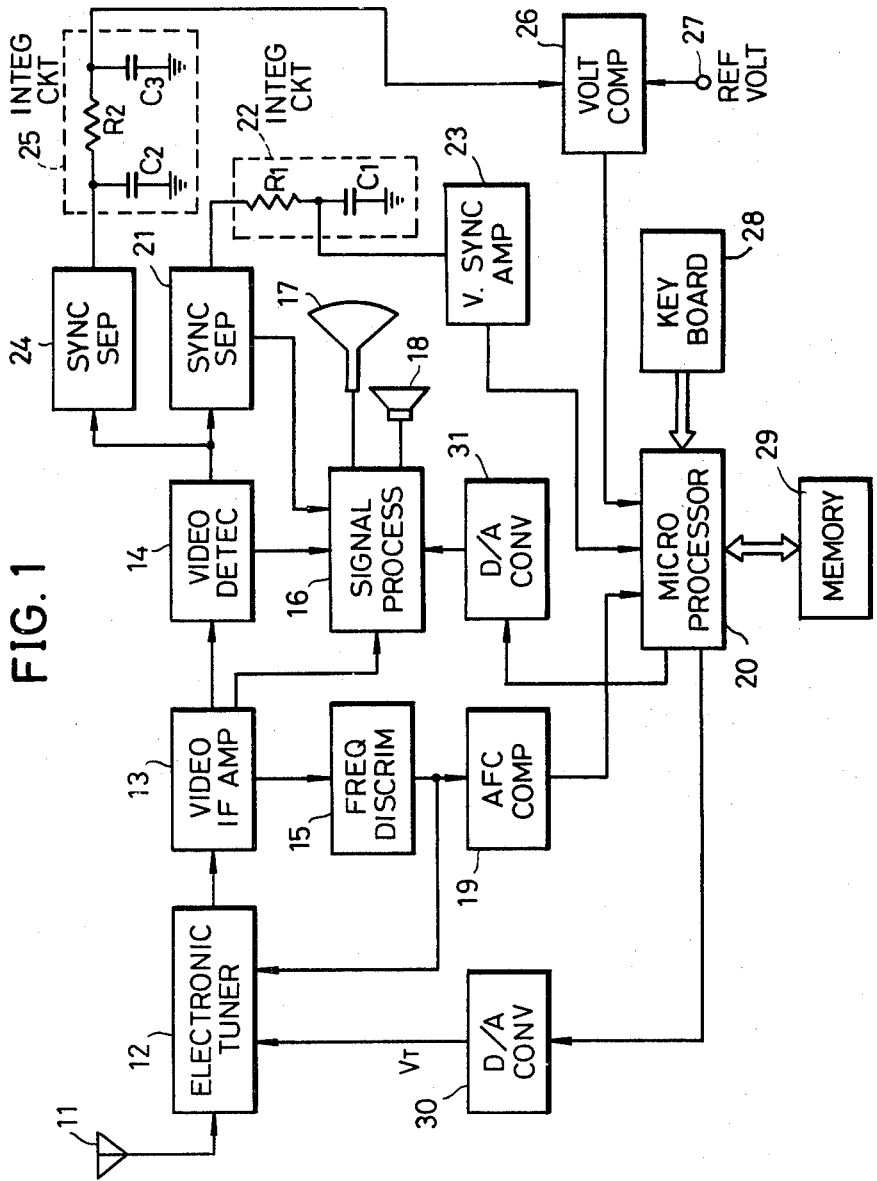
FIG. 1 is a block schematic diagram of an automatic channel search-automatic channel selection system of a television receiver in which one embodiment of the television signal discrimination system according to the present invention is applied.

Referring first to FIG. 1, an RF signal received through an antenna 11 is fed to an electronic tuner 12, where the television signal of a desired channel is selectively tuned. The electronic tuner 12 thereupon produces as output an intermediate frequency (IF) signal, which is supplied through an intermediate-frequency amplifier 13 to a video detection circuit 14, a frequency discrimination circuit 15 for AFC, and a signal processing circuit 16. The detected output of the video detection circuit 14 is supplied to the signal processing circuit 16. This signal processing circuit 16 includes an audio signal demodulation system circuit, a deflection circuit, a video signal demodulation system circuit, and others. This signal processing circuit 16 produces as output a video signal, which is supplied to a cathode-ray tube 17, and an audio signal, which is supplied to a speaker 18.

The output signal of the frequency discrimination circuit 15, on one hand, is supplied to the electronic tuner 12 and, on the other hand, after being rendered into a binary signal in an AFC comparator 19, is supplied to a microprocessor 20.

The output signal of the video detection circuit 14 is supplied to a synchronizing signal separation circuit 21. The vertical synchronizing signal thus separated by the separation circuit 21 is passed through an integration circuit 22 comprising a resistor R1 and a capacitor C1 and, after its waveform has been shaped by a vertical synchronizing signal amplifier 23, is supplied to the microprocessor 20.

As a result of selective manipulation of a key board 28, any signal of various command signals such as automatic channel search, channel selection designation, fine adjustment, and sound volume adjustment is applied to the microprocessor 20. On the basis of this command signal thus applied, the microprocessor 20 carries out storing (writing-in) of data in a memory 29 or reading out of data therefrom.

For example, when a channel selection command signal of a desired channel is applied from the key board 28 to the microprocessor 20, the microprocessor 20 operates to read out the data of that desired channel from the memory 29. In this case, the memory 29 has already had the data stored therein beforehand by an automatic channel selection operation described hereinafter. The microprocessor 20 thereupon produces as output a digital signal, which is supplied to a digital-to-analog (D/A) converter 30 and converted into an analog signal. The resulting output signal is a DC voltage responsive to the content of the data read out from the memory 29 and is applied as a tuning voltage $V_T$ to the electronic tuner 12. Accordingly, the electronic tuner 12 carries out tuning to the signal of the designated desired channel.

When a sound volume adjustment command signal is applied from the key board to the microprocessor 20, a digital signal from the microprocessor 20 is supplied to a digital-to-analog (D/A) converter 31. The D/A converter 31 thereupon produces as output a DC voltage, which is applied as a voltage for sound volume adjustment to the signal processing circuit 16 where it adjusts the volume of the sound emitted from the speaker 18.

The above described circuit organization is that of a television receiver of a known voltage synthesizer system. The automatic channel search operation will now be described. At the time of installation and use of the television receiver in the reception place, it is first necessary to search (channel search) for all channels that can be received at that place and to store the data of the frequencies of the channels in the memory 29. In the case where this channel search operation is carried out automatically, an automatic channel search command signal is applied from the key board 28 to the microprocessor 20. The microprocessor 20 operates in response to this command signal to send as output to the D/A converter 30 data such that the output tuning voltage of the D/A converter 30 increases by degrees.

In a known system, the microprocessor 20 discriminates television signal tuning from only the output of the AFC comparator 19 and the output of the vertical synchronizing signal amplifier 23. More specifically, the output voltage characteristic of the frequency discrimination circuit 15 is a so-called S-curve characteristic with respect to frequency, and the AFC comparator 19 produces a rectangular-wave output of a width equal to the period during which the output voltage of the frequency discrimination circuit 15 is higher than a specific voltage. Therefore, the existence of an output of the AFC comparator 19 means that the receiver has been tuned to the television signal of a certain channel.

Then, since there are a video signal carrier and an audio signal carrier in the television signal of one channel, in the case where there is an output of the AFC comparator 19 and, moreover, there is a vertical synchronizing signal from the vertical synchronizing signal amplifier 23, the microprocessor 20 judges that the television signal of the normal channel has been received and causes data in responsive conformance with that channel frequency to be stored in the memory 29. Thereafter, the operation is similarly continued, and the data for all channels which can be received by the television receiver are stored in the memory 29, whereupon the automatic channel search operation is completed.

Figure 2:
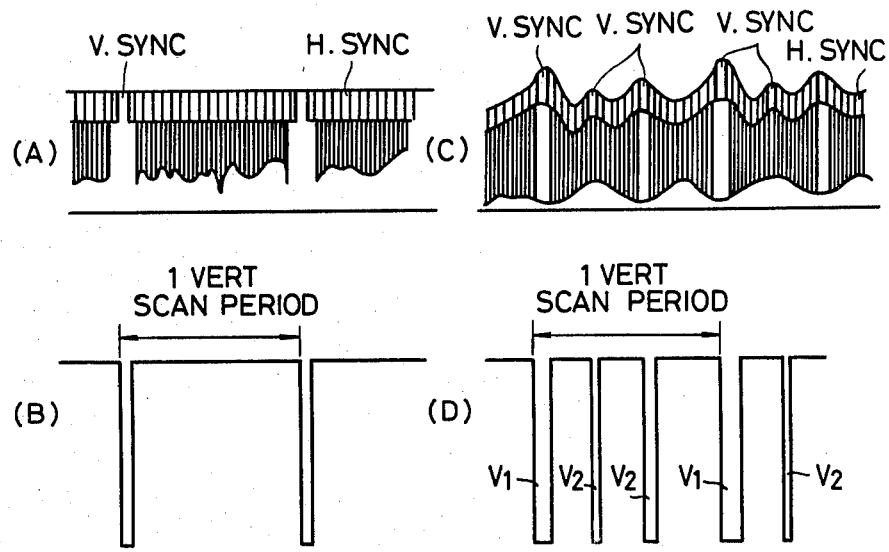
FIGS. 2(A) through 2(D) are waveform charts respectively of a normal television signal and a spurious television signal and waveform charts of vertical synchronizing signals separated therefrom.

Then, in the case where the television receiver is under a strong electric field, as mentioned hereinbefore, a spurious television signal as a useless signal is generated in addition to the television signal of the normal channel as a result of generation of higher harmonics, cross modulation, intermodulation, or the like. In the case where there is no spurious television signal and only the normal television signal exists, the waveform of the output signal of the video detection circuit 14 is as indicated in FIG. 2(A), and the output vertical synchronizing signal of the vertical synchronizing signal amplifier 23 is as indicated in FIG. 2(B). In this case, there is no useless signal in one vertical scanning period, and, furthermore, the width of the vertical synchronizing signal is also of the normal specific value.

However, when a spurious television signal is generated as mentioned above, the waveform of the output signal of the video detection circuit 14 with respect to this spurious television signal becomes as indicated in FIG. 2(C). As indicated, other vertical synchronizing signals exist between the vertical synchronizing signals of every vertical scanning period. Furthermore, the total level is also subjected to modulation. In this case, the waveform of the output signal of the vertical synchronizing signal amplifier 23 is as indicated in FIG. 2(D).

As is apparent from FIG. 2(D), between the vertical synchronizing signals V1, V1 of every vertical scanning period, other useless vertical synchronizing signals V2 are existing. Furthermore, the time constant for setting the slicing level of the synchronizing signal in the synchronizing signal separation circuit 21 is substantially of the order of one vertical scanning period. For this reason, the slicing level cannot quite follow in response to the fluctuation of the envelope of the detected video signal which has been subjected to amplitude modulation as a resultant effect. As a consequence, the slicing level with respect to the vertical synchronizing signal V1 moves further to the side of the video information signal than the normal level position (that is, the slicing level assumes a so-called deep level). For this reason, the normal vertical synchronizing signal is sliced at a level on the video information signal side from the pedestal level. Consequently, the vertical synchronizing signal V1 has a width which is greater than the width of the normal vertical synchronizing signal indicated in FIG. 2(B) in the case where there is no admixing of the above mentioned useless signal.

Thus, in the case where a spurious television signal is generated, vertical synchronizing signals V1 and V2 indicated in FIG. 2(D) exist, and as a result the microprocessor 20 operates erroneously and causes the data at time when there is generation of this spurious television signal to be stored in the memory 29.

Accordingly, in the system of the present invention, the circuit system next described is added to a known circuit to prevent the occurrence of the above mentioned undesirable operation. Returning again to FIG. 1, the output signal of the video detection circuit 14 is supplied to a synchronizing signal separation circuit 24. The vertical synchronizing signal separated here is passed through an integration circuit 25 comprising a resistor R2 and capacitors C2 and C3 connected in $\pi$ formation and is supplied to a voltage comparator 26, where it is compared with a reference voltage supplied through a terminal 27.

Figure 3:
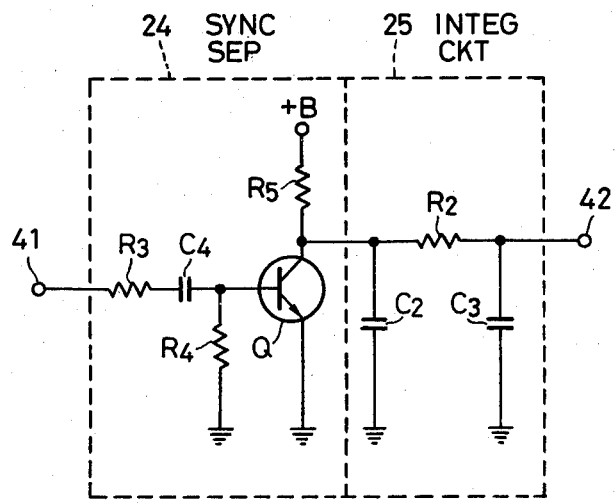
FIG. 3 is a circuit diagram of one embodiment of specific concrete forms of a vertical synchronizing signal separation circuit and an integration circuit in the system illustrated in FIG. 1.

One specific embodiment in concrete form of the above mentioned vertical synchronizing signal separation circuit 24 and integration circuit 25 is shown in FIG. 3. The vertical synchronizing signal separation circuit 24 comprises an NPN switching transistor $\underline{Q}$, resistors R3, R4, and R5, and a capacitor C4. The input side of the resistor R3 is connected to a terminal 41 to which the output signal of the video detection circuit 14 is applied. The emitter of the transistor $\underline{Q}$ is grounded (earthed), and its collector is connected through the resistor R5 to a +B power source. The above mentioned detection output signal applied to the terminal 41 is supplied via the resistor R3 and the capacitor C4 to the base of the transistor $\underline{Q}$. During the period of the vertical synchronizing signal in this detection output signal (the output waveform of the vertical synchronizing signal amplifier 23 corresponding thereto being shown in FIG. 4(A) or 4(C), which is the same as that shown in FIG. 2(B) or 2(D), the transistor $\underline{Q}$ is "ON" and is "OFF" during all other periods.

During the period when the transistor $\underline{Q}$ is "OFF", the capacitor C2, one terminal of which is connected to the collector of the transistor $\underline{Q}$ and the other terminal of which is grounded, of the integration circuit 25 is being charged through the resistor R5 by the +B power source. When the transistor $\underline{Q}$ becomes "ON", the charge thus accumulated in the capacitor C2 is instantaneously discharged through the transistor $\underline{Q}$. In this case, the collector of the transistor $\underline{Q}$ and the capacitor C2 are directly connected, and there is no resistor connected therebetween. For this reason, the discharging time constant of the capacitor C2 at the time when the transistor $\underline{Q}$ is "ON" is very much smaller than the charging time constant at the time when the transistor $\underline{Q}$ is "OFF".

One example of constants of the circuit components constituting the integration circuit 25 is as follows.
Capacitor C2: 10 $\mu$F, Capacitor C3: 4.7 $\mu$F
Resistor R2: 10 K$\Omega$
The capacitance of the capacitor C2 is selected within a range of the order of 1 $\mu$F to 100 $\mu$F, and the capacitance of the capacitor C1 is selected at a relatively large value.

Figure 4:
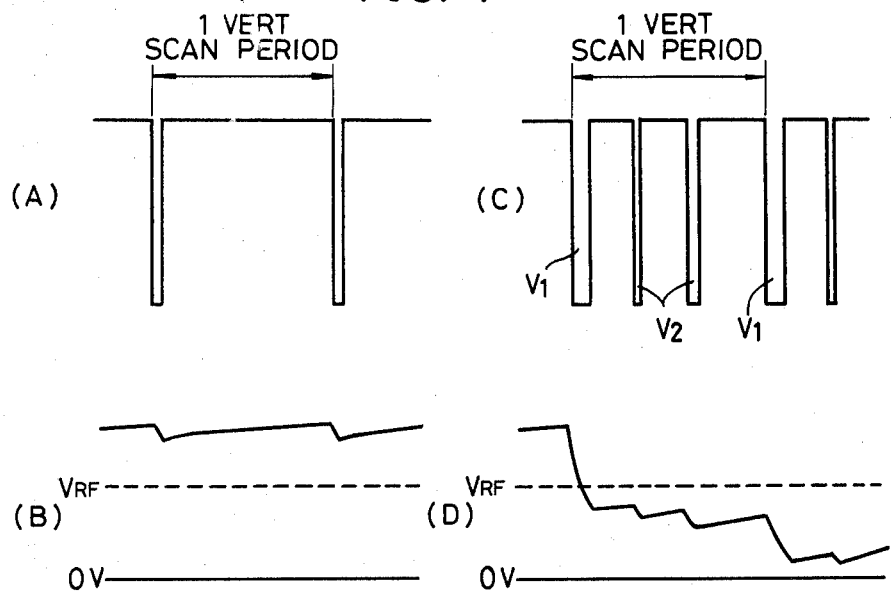
FIGS. 4(A) through 4(D) are waveform charts respectively indicating waveforms of vertical synchronizing signals separated from a normal television signal and a spurious television signal and waveforms of the output voltage of the integration circuit.

Then, in the case where the receiver is tuned to a normal television signal without admixture therein of a useless or undesired signal, the separated vertical synchronizing signal has a specific width as shown in FIG. 4(A). The waveform of the voltage between the two terminals of the capacitor C2 at this time becomes as indicated in FIG. 4(B). Therefore, the capacitor C2 undergoes discharging during the period of the vertical synchronizing signal, but the voltage of the capacitor C2 is always greater than the reference voltage $V_{RF}$ supplied through the terminal 27 to the voltage comparator 26.

The voltage comparator 26 compares the relation of the magnitudes of the voltage from the integration circuit 25 and the reference voltage $V_{RF}$ supplied through the terminal 27. When the voltage from the integration circuit 25 is higher than the reference voltage $V_{RF}$, the voltage comparator 26 applies an output signal of high (H) level to the microprocessor 20. Conversely, when the voltage from the integration circuit 25 is lower than the reference voltage $V_{RF}$, it applies an output signal of low (L) level to the microprocessor 20.

Accordingly, when the electronic tuner 12 tunes to a normal television signal, an H-level signal is applied from the voltage comparator 26 to the microprocessor 20, which makes a synthesized judgement from this H-level signal and the output signals of the AFC comparator 19 and the vertical synchronizing signal amplifier 23 thereby to determine that the tuned television signal is a normal television signal and to cause the data relating to the frequency of its channel to be written in the memory 29 and further continues the automatic channel search operation.

On the other hand, in the case of a spurious television signal, as described above, the separated vertical synchronizing signal is as indicated in FIG. 4(C). Since the width of the vertical synchronizing signal V1 in this case is greater than the width of the normal vertical synchronizing signal indicated in FIG. 4(A), the capacitor C2 rapidly discharges in the period of the vertical synchronizing signal V1 of great width, and its voltage drops rapidly. More specifically, the synchronizing signal slicing level of the synchronizing signal separation circuit 24 becomes deep with respect to the spurious television signal as mentioned above. For this reason, the base voltage of the transistor $\underline{Q}$ becomes high, and the base current becomes greater than that at the time of the vertical synchronizing signal of the normal television signal. As a consequence, the discharging current of the capacitor C2 increases proportionally to the base current. Furthermore, since there is no resistor between the capacitor C2 and the collector of the transistor $\underline{Q}$, the discharging current does not become saturated.

In addition, since other vertical synchronizing signals V2 exist also between the vertical synchronizing signals V1 and V1, the capacitor C2 discharges also during the read-period in which these signals V2 exist. For this reason, the waveform of the voltage supplied from the integration circuit 25 to the voltage comparator 26 becomes as indicated in FIG. 4(D), and this voltage becomes lower than the reference voltage $V_{RF}$.

Thus, in the case where the electronic tuner 12 is tuned to a spurious television signal, an L-level signal is applied from the voltage comparator 26 to the microprocessor 20. At this time, the microprocessor 20 judges that the signal to which the electronic tuner 12 is tuned is a spurious television signal, and no writing of data in the memory 29 is carried out. The electronic tuner 12 continues the automatic channel search operation.

The voltage comparator 26 is constituted by the use of, for example, an operational amplifier. In this case, the noninverting input terminal of the operational amplifier is connected to the integration circuit, while the inverting input terminal thereof is connected to the reference voltage terminal 27. The output terminal of operational amplifier is connected to the microprocessor 20.

Figure 5:
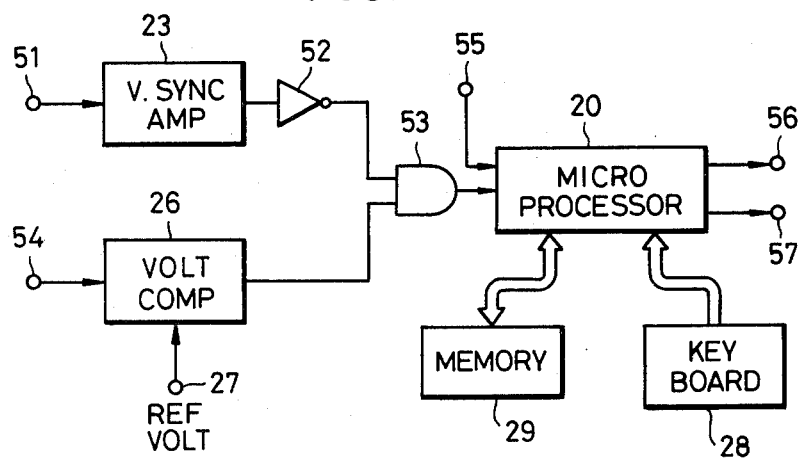
FIG. 5 is a block schematic diagram of the essential parts of another embodiment of the system of the invention.

The essential parts of another embodiment of the system of the invention will now be described in conjunction with FIG. 5. In FIG. 5, those parts which are the same as those corresponding parts in FIG. 1 are designated by like reference numerals. Description of such parts will be omitted.

A signal which has been separated by the synchronizing signal separation circuit 21 and passed through the integration circuit 22 is supplied through a terminal 51 to a vertical synchronizing signal amplifier 23. The resulting output signal of this amplifier 23 is applied via an inverter 52 to one of the input terminals of a two-input AND gate 53. On the other hand, a signal separated by the synchronizing signal separation circuit 24 and passed through the integration circuit 25 is applied through a terminal 54 to a voltage comparator 26, where it is compared with a reference voltage $V_{RF}$ supplied through a terminal 27. The resulting output of the voltage comparator 26 is applied to the other input terminal of the AND gate 53.

The AND gate 53 passes the output vertical synchronizing signal of the vertical synchronizing signal amplifier 23 arriving through the inverter 52 only when the electronic tuner is tuned to a normal television signal, and the output of the voltage comparator 26 is of H-level, and supplies this signal to the microprocessor 20. The microprocessor 20 determines from the signal passed by the AND gate 53 and a signal supplied from the AFC comparator 19 through a terminal 55 that the signal to which the electronic tuner is tuned is a normal television signal and causes the memory 29 to carry out storing operation. Terminals 56 and 57 of the microprocessor 20 are connected respectively to the D/A converters 30 and 31.

When there is a spurious television signal, the output of the voltage comparator 26 assumes an L-level as stated hereinabove. For this reason, the AND gate 53 does not pass the signal arriving through the inverter 52. As a result, only the signal from the AFC comparator 19 is supplied through the terminal 55 to the microprocessor 20, which thereby judges that the signal is a spurious television signal and does not cause the memory 29 to carry out storing operation.

Further, this invention is not limited to these embodiments but various variations and modifications may be made without departing from the scope of the invention.

What we claim is:

1. In a television receiver provided with an electronic tuner for producing as output an intermediate-frequency signal whose synchronizing frequency is varied in response to an applied voltage and with means for detecting the output signal of the electronic tuner, the combination therewith of a television signal discrimination system comprising:

a first synchronizing signal separation circuit supplied with the output of said detection means and separating a vertical synchronizing signal;
a first integration circuit connected to the output side of the first synchronizing signal separation circuit;
means for supplying a reference voltage;
means supplied with an output voltage of the first integration circuit and the reference voltage and operating to compare the magnitudes thereof;
a second synchronizing signal separation circuit supplied with the output of the detection means and separating a vertical synchronizing signal;
a second integration circuit connected to the output side of the second synchronizing signal separation circuit;
means for discriminating the frequency of the output of the electronic tuner; and
means for discriminating a normal television signal on the basis of the output of the voltage comparing means, the output of the second integration circuit, and the output of the frequency discriminating means,
the first synchronizing signal separation circuit and the first integration circuit producing, as output, different voltages, with the reference voltage as a borderline, depending on and distinguishing between the case where the output signal of the detection means is a normal television signal and the case where said output signal is a different spurious television signal.

2. A television signal discrimination system as claimed in claim 1 in which the first synchronizing signal separation circuit and the first integration circuit produce as an output voltage higher than the reference voltage in the case where the output signal of the detection means is a normal television signal and produce as an output voltage lower than the reference voltage in the case where the output signal of the detection means is a spurious television signal, and the voltage comparing means produces as output a signal of high level in the case where the voltage from the first integration circuit is higher than the reference voltage and produces as output a signal of low level in the case where said voltage from the first integration circuit is lower than the reference voltage.

3. A television signal discrimination system as claimed in claim 1 in which the first synchronizing signal separation circuit includes a transistor having a base to which the output signal of the detection means is applied, an emitter which is grounded, and a collector connected through a resistor to an electric power source, and the first integration circuit includes a charge-and-discharge capacitor connected directly to the collector of the transistor.

4. A television signal discrimination system as claimed in claim 1 in which the discriminating means is a microprocessor, which is supplied with the output of the voltage comparing means, the output of the second integration circuit, and the output of the frequency discriminating means.

5. A television signal discrimination system as claimed in claim 1 in which the discriminating means comprises an AND gate supplied with the output of the voltage comparing means and the output of the second integration circuit and a microprocessor supplied with the output of the AND gate and the output of the frequency discriminating means and carrying out said discrimination.

6. A television signal discrimination system as claimed in claim 1 in which the television receiver further has a memory for storing data corresponding to channels to be selected, and, at the time of channel search, the discriminating means carries out control operation with respect to the memory in a manner such that when the discriminating means discriminates a normal television signal, it causes data conforming to the channel thereof to be stored in the memory, and when it discriminates a spurious television signal, it does not cause the memory to store any data.

* * * * *